United States Patent
Hatanaka

(10) Patent No.: US 7,295,042 B2
(45) Date of Patent: Nov. 13, 2007

(54) BUFFER

(75) Inventor: Shingo Hatanaka, Cambridge, MA (US)

(73) Assignee: Analog Devices, Inc., Norwood, MA (US)

( * ) Notice: Subject to any disclaimer, the term of this patent is extended or adjusted under 35 U.S.C. 154(b) by 15 days.

(21) Appl. No.: 10/894,811

(22) Filed: Jul. 20, 2004

(65) Prior Publication Data

US 2006/0017465 A1 Jan. 26, 2006

(51) Int. Cl.
H03K 19/094 (2006.01)
H03K 19/0175 (2006.01)

(52) U.S. Cl. .......................... 326/87; 326/30; 326/68; 326/85; 326/86; 326/112; 326/115; 327/95; 327/96

(58) Field of Classification Search .................. 326/87, 326/85, 91, 83, 88; 327/112, 337; 330/262
See application file for complete search history.

(56) References Cited

U.S. PATENT DOCUMENTS

| | | | | |
|---|---|---|---|---|
| 4,988,900 A * | 1/1991 | Fensch | ...................... | 327/337 |
| 5,391,999 A * | 2/1995 | Early et al. | ................... | 327/337 |
| 5,525,920 A * | 6/1996 | Rakers et al. | ................. | 327/65 |
| 5,847,601 A * | 12/1998 | Wang | ............................. | 330/9 |
| 5,949,252 A * | 9/1999 | Taguchi | ....................... | 326/86 |
| 5,959,475 A * | 9/1999 | Zomorrodi | ................... | 327/112 |
| 6,169,427 B1 * | 1/2001 | Brandt | ......................... | 327/94 |
| 6,184,726 B1 * | 2/2001 | Haeberli et al. | .............. | 327/96 |
| 6,437,628 B1 * | 8/2002 | Davenport et al. | ......... | 327/333 |
| 6,445,331 B1 * | 9/2002 | Stegers | ........................ | 341/172 |
| 6,611,164 B2 * | 8/2003 | Uno | ............................ | 327/361 |
| 6,636,084 B2 * | 10/2003 | Sarraj | .......................... | 327/95 |
| 6,642,751 B1 * | 11/2003 | Quinn | ........................ | 327/94 |
| 6,664,805 B2 * | 12/2003 | Gonzalez | ..................... | 326/26 |
| 6,778,009 B1 * | 8/2004 | Lee | ................................ | 330/9 |
| 6,911,858 B2 * | 6/2005 | Mori | .......................... | 327/307 |
| 6,940,348 B2 * | 9/2005 | Confalonieri et al. | ......... | 330/69 |
| 6,956,519 B1 * | 10/2005 | Huang et al. | ............... | 341/172 |
| 6,967,509 B2 * | 11/2005 | Rossi | .......................... | 327/124 |
| 7,002,506 B1 * | 2/2006 | Tadeparthy et al. | ......... | 341/161 |
| 7,019,551 B1 * | 3/2006 | Biesterfeldt | ................. | 326/29 |
| 7,088,147 B2 * | 8/2006 | Prasad et al. | ................ | 327/91 |
| 2002/0033729 A1 * | 3/2002 | Lee et al. | .................... | 327/337 |
| 2002/0093365 A1 * | 7/2002 | Uno | ............................ | 327/104 |
| 2005/0040889 A1 * | 2/2005 | Tsuchi | ........................ | 330/255 |

OTHER PUBLICATIONS

Adel S. Sedra, Kenneth C. Smith; Microelectronic Circuits, 4th edition. pp. 408, 409, 411, and 416□□1998 Oxford University Press, Inc. Oxford NY.*

Adel S. Sedra, Kenneth C. Smith; Microelectronic Circuits, 4th Edition. pp. 408, 409, 411, 416□□1998 Oxford University Press, Inc. Oxford NY.*

(Continued)

Primary Examiner—Rexford Barnie
Assistant Examiner—Dylan White
(74) Attorney, Agent, or Firm—Wolf Greenfield & Sacks, P.C.

(57) ABSTRACT

A switched capacitor buffer operating by the push-pull method is taught. The buffer may include a pull-up device and a pull-down device. A switched capacitor circuit may be used to control the pull-up device and the pull-down device to achieve accurate push-pull operation. According to some embodiments, the switched capacitor buffer displays an optimal combination of design simplicity, low power consumption and high-frequency response.

27 Claims, 12 Drawing Sheets

OTHER PUBLICATIONS

Masuda et al., "CMOS Sampled Differential Push-Pull Cascode Operational Amplifier", ISCAS 1984, pp. 1211-1214, no month.

Allen Holberg, "CMOS Analog Circuit Design", Oxford University Press, $2^{nd}$ Edition, pp. 375-378, no date.

* cited by examiner

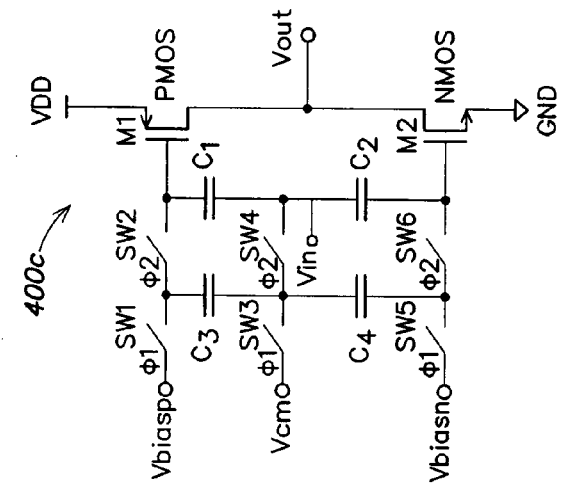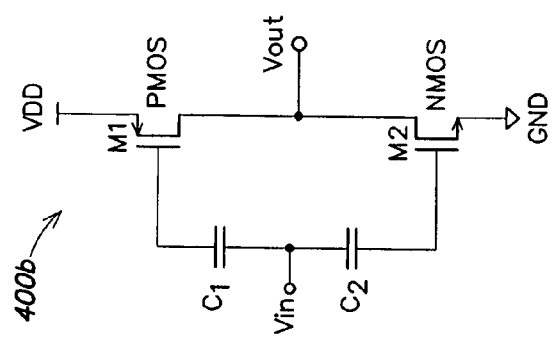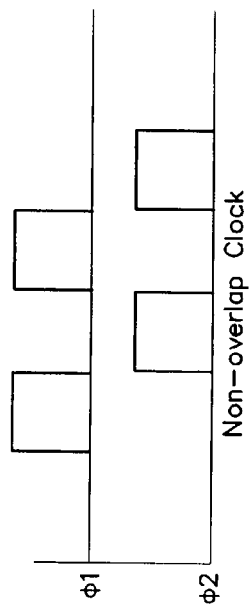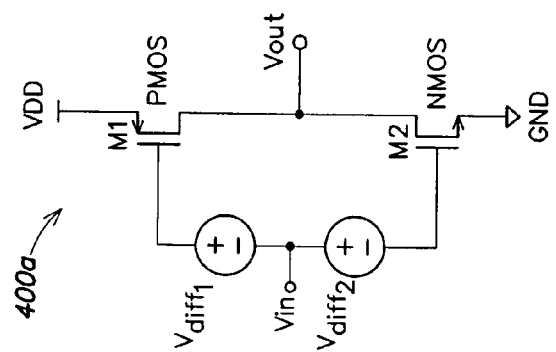
FIG. 4C
FIG. 4B
FIG. 4D
FIG. 4A

FIG. 5A  Sample Phase
FIG. 5B  Hold Phase

*Sample Phase*

*Hold Phase*

Track Phase

Hold Phase

Hold Phase

Track Phase

BUFFER

BACKGROUND OF INVENTION

1. Field of Invention

The present invention relates to buffers. More particularly, the present invention relates to buffers employing push-pull operation.

2. Discussion of Related Art

Buffers are well known in electronics. FIG. 1A is a schematic representation of one type of prior art buffer 100a, which is configured as a source follower. The buffer 100a includes a transistor M1, a transistor M2, and a load CL, which is illustrated as a capacitor. In the illustrated example, transistors M1 and M2 are NMOS transistors. A drain terminal of transistor M1 is connected to a voltage supply VDD, while a gate terminal of transistor M1 receives an input signal Vin. Transistor M2 is configured as a current source, and is biased by signal Vbn. An output signal Vout of buffer 100a is provided by a source terminal of transistor M1, which corresponds to a drain terminal of transistor M2. A load CL is also connected to this terminal. When input signal Vin transitions from a low to high state, output signal Vout is able to closely track signal Vin. However, the buffer 100a exhibits an inadequate negative slew rate, such that when input signal Vin transitions from a high state to a low state the output signal Vout is unable to accurately follow input signal Vin. This is due in part to the limited current which transistor M2 can sink. Another drawback of buffer 100a is that it may also exhibit high power consumption when input signal Vin is static.

FIG. 1B is a schematic representation of another prior art buffer 100b, referred to as a low swing push-pull buffer. The buffer 100b includes a transistor M1 and a transistor M2. Transistor M1 is an NMOS transistor and has a drain terminal connected to a voltage supply VDD. Transistor M2 is as a PMOS transistor and has a drain terminal connected to ground. A load CL is connected between a source terminal of transistor M1 and ground. Output signal Vout is provided by the source terminal of transistor M1. Buffer 100b operates by the push-pull method. A splitter 12 using a linear circuit is used to split the input signal Vin into two outputs to drive the gates of NMOS transistor M1 and PMOS transistor M2 to achieve the push-pull operation. The buffer 100b suffers from a headroom problem when used with a low voltage design, and specifically with a low value of VDD. The headroom problem can be caused by the fact that the threshold voltage of the MOS transistors can limit the ability of Vout to reach the value of Vin, the two values being different from each other by a value of the MOS transistor threshold voltage.

FIG. 1C is a schematic representation of another prior art buffer 100c, referred to as a high swing push-pull buffer. The buffer 100c includes a transistor M1 and a transistor M2. Transistor M1 is a PMOS transistor and has a source terminal connected to a voltage supply VDD. Transistor M2, which is an NMOS transistor, has a drain terminal connected to the drain terminal of transistor M1. The drain terminal of transistor M1 is also connected to a terminal of load CL. A second terminal of load CL is connected to ground. An input signal Vin is supplied to a splitter 12, which uses a linear circuit to produce two outputs to drive the gates of transistors M1 and M2. Drawbacks of the buffer 100c include the fact that it generates additional poles and does not always meet power consumption constraints. Furthermore, the design is complex and the buffer demonstrates poor high frequency response.

In general, design constraints considered when designing a buffer may include the ability of the buffer to drive a large load, the dynamic and static power consumption of the buffer, frequency response, the complexity of design and manufacture of the buffer, and/or other characteristics of the buffer structure and operation. The circuits described thus far do not optimally satisfy all design constraints in various applications.

SUMMARY OF INVENTION

Aspects of the present invention are directed toward providing a buffer that, compared to some prior art circuits, is capable of driving large loads, has low power consumption, good frequency response, is simple in design, and is simple to manufacture.

According to an embodiment of the invention, a push-pull circuit receiving an input signal and providing an output signal is provided. The push-pull circuit comprises a pull-up device, a pull-down device, and a switched capacitor circuit coupled to the pull-up device and the pull-down device.

According to another embodiment of the invention, a method of operating a push-pull circuit comprising a pull-up device and a pull-down device is provided. The method comprises using a switched capacitor circuit to control the pull-up device and the pull-down device to achieve push-pull operation.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIGS. 4A-4C are schematic representations of a common source type buffer as taught herein;

FIG. 4D illustrates non-overlapping clock signals as may be used in a buffer of the type illustrated in FIG. 4C;

FIGS. 5A-5B are schematic representations of a sample phase and a hold phase of a common source operational amplifier as taught herein;

DETAILED DESCRIPTION

Figure 1C:
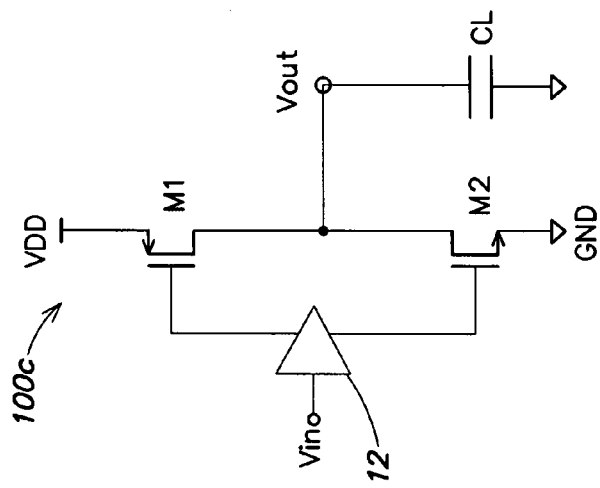
FIGS. 1A-1C are schematic representations of prior art buffers.
Figure 1B:
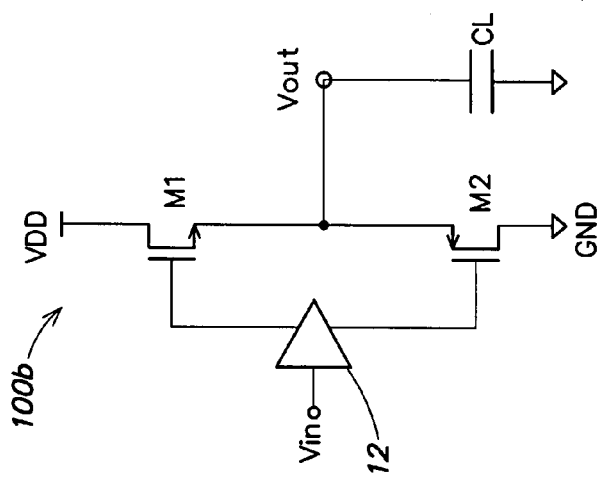
Figure 1A:
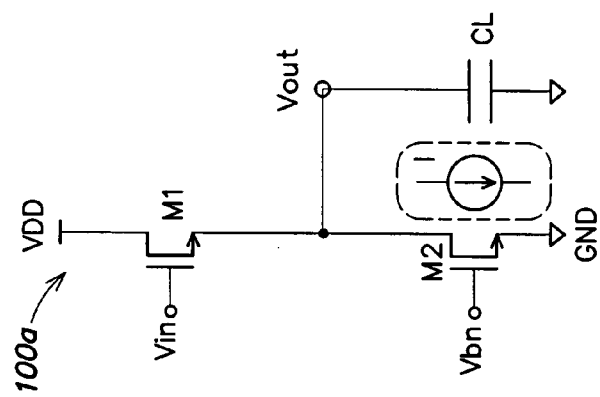

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

Embodiments of the present invention provide a buffer with an optimal combination of power consumption, load-driving ability, simplicity of configuration and frequency response for various applications. Thus, embodiments of the present invention solve at least some of the problems associated with conventional circuits, as well as providing additional advantages.

According to one embodiment, a buffer that operates in a push-pull manner is provided. The buffer includes a pull-up device and a pull-down device, the pull-up device and the pull-down device being controlled by a switched capacitor circuit. According to one embodiment, the pull-up device and the pull-down device are formed by transistors. According to one embodiment, the switched capacitor circuit is a single input switched capacitor circuit, and the buffer provides a single output. A feedback signal may also be provided from the output signal to the switched capacitor circuit.

According to an embodiment of the invention, a differential input buffer is provided that provides two output signals. The differential input buffer includes two pull-up devices, two pull-down devices, and a switched capacitor circuit. The switched capacitor circuit is configured to drive the pull-up devices and the pull-down devices. According to an embodiment, the pull-up devices and the pull-down devices are realized by transistors. According to an embodiment of the invention, the buffer includes a feedback signal. The feedback signal is provided between an output of the buffer and the switched capacitor circuit.

Embodiments of the present invention provide a switched capacitor buffer operating in a push-pull manner that may be used as an amplifier. According to other embodiments, the switched capacitor buffer may be utilized as a common source dual input operational amplifier. According to another embodiment, the switched capacitor buffer is configured to operate as a track and hold circuit.

According to an embodiment of the invention, a switched capacitor buffer is configured as a source follower. The switched capacitor buffer may be used in a track and hold circuit. The track and hold circuit has low power consumption, and can operate at high frequency. The switched capacitor buffer also displays accurate push-pull operation.

Figure 2A:
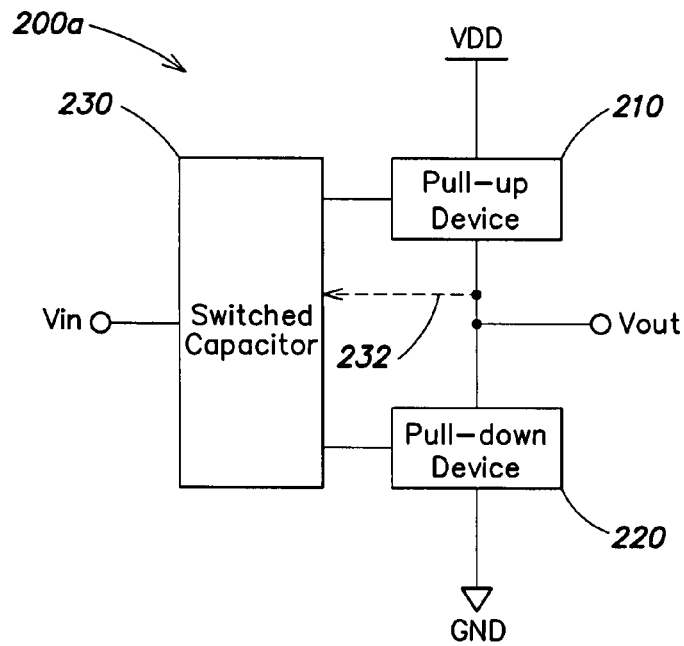
FIGS. 2A and 2B are block diagram representations of two types of buffer as taught herein.

FIG. 2A is a block diagram representation of a buffer according to an embodiment of the present invention. The buffer 200*a* is a single input buffer, and includes a pull-up device 210, a pull-down device 220, and a switched capacitor circuit 230. The pull-up device 210 and the pull-down device 220 are three-terminal devices. A first terminal of pull-up device 210 is configured to receive a voltage signal VDD. A second terminal of the pull-up device 210 is coupled to a first terminal of the pull-down device 220, this common terminal providing an output signal Vout of the buffer 200*a*. A second terminal of pull-down device 220 is connected to ground. The switched capacitor circuit 230 is configured to control the pull-up device 210 and the pull-down device 220 by supplying respective control signals to the respective third terminals of the pull-up device 210 and pull-down device 220. The switched capacitor circuit 230 is also configured to receive an input signal Vin. A feedback path 232 is provided to input the output signal Vout to the switched capacitor circuit 230. The buffer 200*a* operates by the push-pull method, and the feedback path 232 helps to enable high accuracy push-pull operation.

Figure 2B:
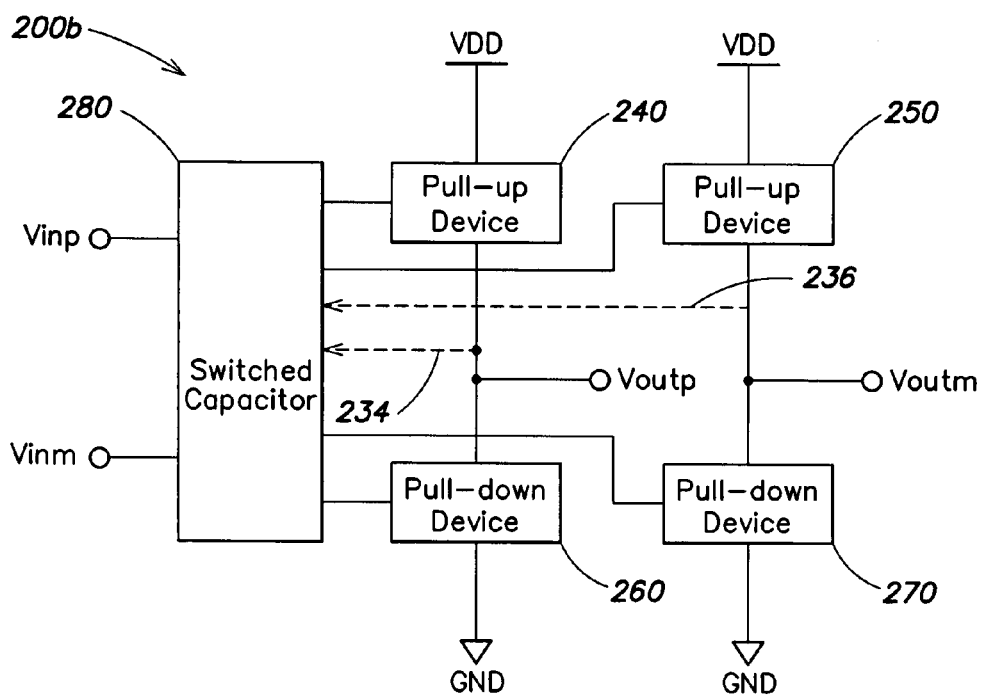

FIG. 2B is a block diagram representation of a buffer 200*b* according to another embodiment of the present invention. The buffer 200*b* is a differential input buffer and operates by the push-pull method. The buffer 200*b* includes pull-up device 240, pull-up device 250, pull-down device 260, pull-down device 270 and switched capacitor circuit 280. The pull-up device 240, pull-up device 250, pull-down device 260, and pull-down device 270 are three-terminal devices. A first terminal of pull-up device 240 and a first terminal of pull-up device 250 are configured to receive a voltage signal VDD. A second terminal of pull-up device 240 is coupled to a first terminal of pull-down device 260. A second terminal of pull-down device 260 is connected to ground. The common terminal of pull-up device 240 and pull-down device 260 provides a first output signal Voutp of buffer 200*b*. A third terminal of pull-up device 240 and a third terminal of pull-down device 260 are each configured to receive respective control signals output from switched capacitor circuit 280. A feedback path 234 is provided to input the first output signal Voutp to the switched capacitor circuit 280.

A second terminal of pull-up device 250 is coupled to a first terminal of pull-down device 270. This common terminal of pull-up device 250 and pull-down device 270 is configured to provide a second output signal Voutm. A third terminal of pull-up device 250 and a third terminal of pull-down device 270 are each configured to receive respective control signals from switched capacitor circuit 280. Switched capacitor circuit 280 has a first input configured to receive a first input signal Vinp, and a second input configured to receive a second input signal Vinm. A feedback path 236 is provided to input the second output signal Voutm to the switched capacitor circuit 280.

Figure 3C:
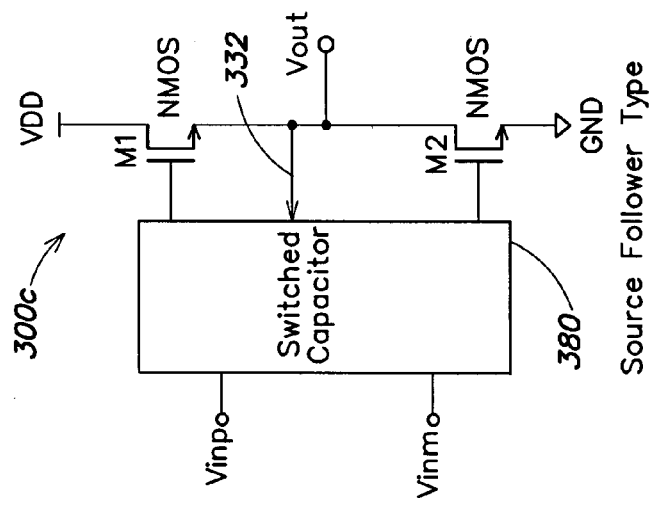
FIGS. 3A-3C are schematic representations of single input switched capacitor buffers as taught herein.
Figure 3B:
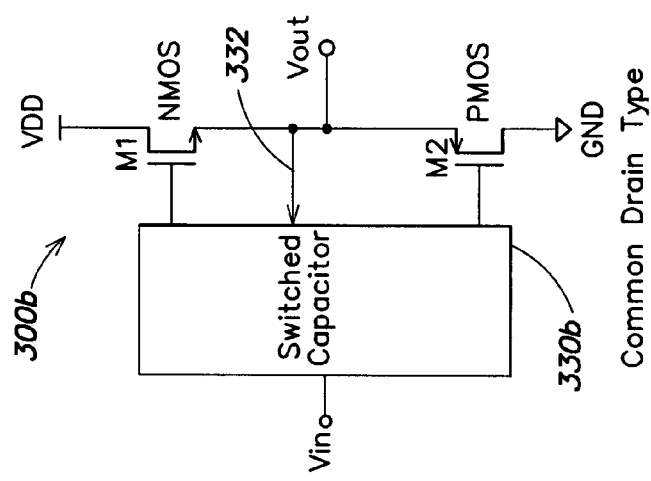
Figure 3A:
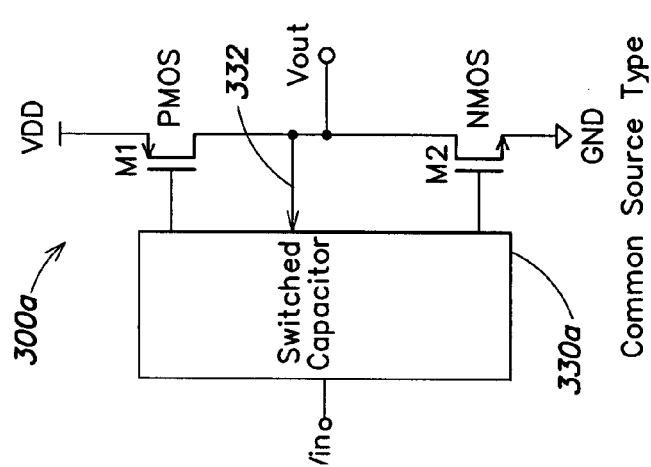

FIG. 3A is a schematic representation of an example of a single input switched capacitor buffer corresponding to buffer 200*a* of FIG. 2A. More specifically, the buffer 300*a* is a single input common source type buffer. The buffer 300*a* comprises a transistor M1, a transistor M2, and a switched capacitor circuit 330*a*. Transistor M1 is a PMOS transistor having a source terminal configured to receive a voltage signal VDD. Transistor M2 is an NMOS transistor having a source terminal connected to ground. A drain terminal of PMOS transistor M1 is connected to a drain terminal of NMOS transistor M2, this common terminal configured to provide an output signal Vout. Switched capacitor circuit 330*a* has an input configured to receive an input signal Vin, an output configured to drive a gate terminal of transistor M1, and an output configured to drive a gate terminal of transistor M2. A feedback path 332 is provided from the voltage signal output Vout to the switched capacitor circuit 330a. The buffer 300a operates as a gain stage and can be used in any application requiring high slew rate and high gain.

If buffer 300a is used without feedback path 332, an additional stage (not shown) may need to be added to provide an offset voltage for the switched capacitor circuit 330a, as further described in connection with FIGS. 4A-4C. The use of an additional stage for this purpose will cause the buffer operation to display complex poles. The use of the feedback path 332 can eliminate the need for the additional stage, and therefore eliminate the generation of complex poles. The use of the feedback path can thus simplify the design of the buffer.

FIG. 3B is a schematic representation of another example of a single input switched capacitor buffer corresponding to buffer 200a of FIG. 2A. The buffer 300b is a single input common drain type switched capacitor buffer, and operates by the push-pull method. The buffer 300b comprises a transistor M1, a transistor M2, and a switched capacitor circuit 330b. Transistor M1 is an NMOS transistor and has a drain terminal configured to receive a voltage signal VDD. Transistor M2 is a PMOS transistor and has a drain terminal connected to ground. A source terminal of transistor M1 is connected to a source terminal of transistor M2, this common terminal being configured to provide an output signal Vout. Switched capacitor circuit 330b has an input configured to receive an input signal Vin, an output configured to drive a gate terminal of transistor M1, and an output configured to drive a gate terminal of transistor M2. A feedback path 332 is provided to input the output signal Vout to the switched capacitor circuit 330b, and enables the accurate push-pull operation of the buffer.

Since the gate nodes of transistors M1 and M2 are floating nodes, it is possible for the gate node of transistor M1 to go above VDD, and for the gate node of transistor M2 to go below GND. Thus, the buffer 300b is free of headroom problems associated with some conventional circuits, as previously described. Therefore, the output signal Vout is able to accurately track the input signal Vin, without there being any difference between the values of the two signals due to the threshold voltages of the MOS transistors.

FIG. 3C is a schematic representation of an example of a differential input switched capacitor buffer according to an embodiment of the present invention. The buffer 300c comprises a transistor M1, a transistor M2, and a switched capacitor circuit 380. Transistor M1 is an NMOS transistor and has a drain terminal configured to receive a voltage signal VDD. Transistor M2 is an NMOS transistor having a source terminal connected to ground. Transistor M1 has a source terminal connected to a drain terminal of transistor of M2, this common terminal being configured to provide an output signal Vout. Switched capacitor circuit 380 has a first input configured to receive a first input signal Vinp, and a second input configured to receive a second input signal Vinm. Switched capacitor circuit 380 further comprises a first output configured to drive a gate terminal of transistor M1, and a second output configured to drive a gate terminal of transistor M2. A feedback path 332 is provided to input the output signal Vout to the switched capacitor circuit 380, and again enables the accurate push-pull operation of the buffer. The buffer 300c functions as a source follower.

It should be appreciated that the buffer 300c may further comprise a second pull-up device and a second pull-down device, similar to the configuration of buffer 200b of FIG. 2B. The buffer 300c could then provide a second output, and may further include a feedback path from the second output to the switched capacitor circuit 380.

Several common source switched capacitor buffers will now be described. First, FIGS. 4A-4C illustrate in more detail a single input common source switched capacitor buffer according to an embodiment of the present invention. In contrast to the configuration of buffer 300a of FIG. 3A, the buffers of FIGS. 4A-4C do not include a feedback path. FIG. 4A illustrates a buffer 400a that comprises PMOS transistor M1 and NMOS transistor M2. A source terminal of transistor M1 is configured to receive a voltage signal VDD. A source terminal of transistor M2 is connected to ground. A drain terminal of transistor M1 is connected to a drain terminal of transistor M2, this common terminal being configured to provide an output signal Vout. The buffer 400a receives a single input signal Vin. In order for the buffer 400a to operate in the push-pull manner, a voltage difference Vdiff1 is maintained between the input signal Vin and a gate terminal of transistor M1. A voltage difference Vdiff2 is maintained between the input signal Vin and a gate terminal of transistor M2.

FIG. 4B illustrates a manner in which the voltage differences Vdiff1 and Vdiff2 of FIG. 4A may be realized. Specifically, a capacitor C1 may be arranged between input signal Vin and the gate terminal of transistor M1. Another capacitor C2 may be arranged between the input signal Vin and a gate terminal of transistor M2. The use of capacitors to produce the voltage differences Vdiff1 and Vdiff2 result in the respective gate nodes of transistors M1 and M2 being floating nodes. Since the gate node of transistor M1 and the gate node of transistor M2 are floating nodes, it is necessary to charge the capacitors C1 and C2. This may be accomplished using a circuit such as that shown in FIG. 4C, and now described.

The buffer 400c comprises transistors M1 and M2, and capacitors C1 and C2, as previously described in connection with FIG. 4B. A charging circuit is also provided to charge the floating gate nodes of transistors M1 and M2. The charging circuit comprises switches SW1-SW6, and uses bias signals Vbiasp and Vbiasn. Capacitors C3 and C4 are also included.

Bias signals Vbiasp and Vbiasn are constant signals, and may take any value. It is desirable to choose Vbiasp and Vbiasn so as to ensure that the currents in transistors M1 and M2 are approximately equivalent to each other. The switches SW1-SW6 are alternately controlled by non-overlapping clock signals ΦD and Φ2, and therefore function to charge capacitors C1-C4 appropriately to obtain accurate push-pull operation of the buffer. Illustrative waveforms for signals Φ1 and Φ2 are shown in FIG. 4D.

Specifically, switches SW1, SW3 and SW5 closing on a rising edge of clock signal Φ1. With switch SW3 closed, capacitor C3 is biased by signal Vbiasp and common mode voltage Vcm. In this embodiment, common mode voltage Vcm is the buffer input common mode voltage, although any value could be used for Vcm, and the invention is not limited in this respect. Capacitor C4 is biased by signal Vbiasn and the Vcm. Switches SW1, SW3 and SW5 open during the subsequent falling edge of clock signal ΦD. Then, the rising edge of clock signal Φ2 closes switches SW2, SW4 and SW6. Therefore, capacitors C3 and C1 are connected in parallel, and are biased by input signal Vin. Capacitors C4 and C2 are also connected in parallel and are biased by input signal Vin. In this manner, the buffer 400c operates by the push-pull method.

In addition, since a feedback path is not included in the buffer 400c, an additional stage, not shown, is needed to create the offset voltage for the buffer. This additional stage could be any stage, including, but not limited to, a conventional differential stage as would be know to those of skill in the art. The use of an additional stage to create the offset voltage will generate an additional pole in the operation of the buffer, so that buffer 400c is a 2 pole system.

Another type of common source switched capacitor buffer according to an embodiment of the present invention is a common source dual input operational amplifiers. FIGS. 5A and 5B illustrate the sample phase and hold phase of a common source dual input operational amplifier 500, of the type previously described in connection with FIG. 3A. The dual input operational amplifier shown is configured as a multiple digital-to-analog converter (MDAC), and may be combined with other stages to form a digital-to-analog converter. In the illustrated embodiment, signals Vin and Vout are analog signals. It should also be appreciated that the use of the term "dual-input" in this context refers to the fact that input signal Vin is supplied to transistor M1 as well as transistor M2, and should not be confused with the differential input type of buffer previously described in connection with FIG. 3B.

Figure 5C:
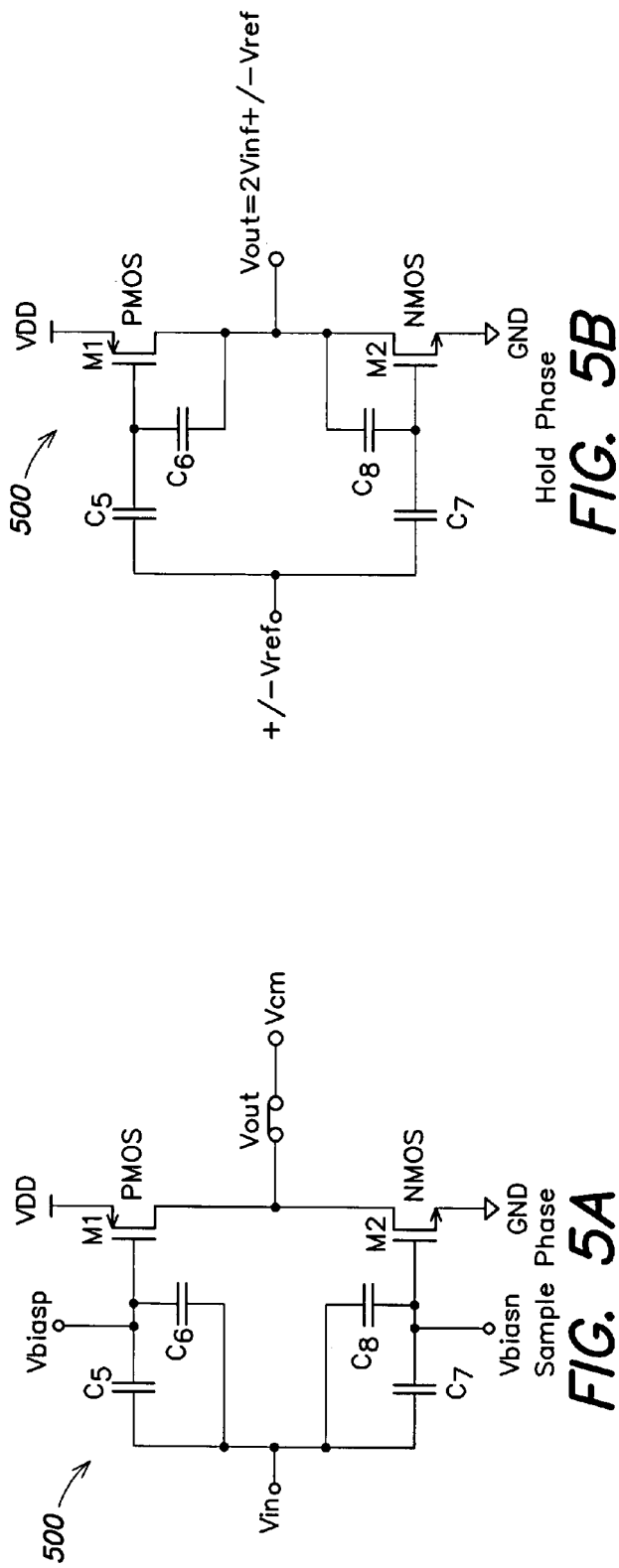
FIG. 5C illustrates waveforms of an input signal and an output signal in connection with the sample phase and hold phase of FIGS. 5A and 5B.
Figure 5C:
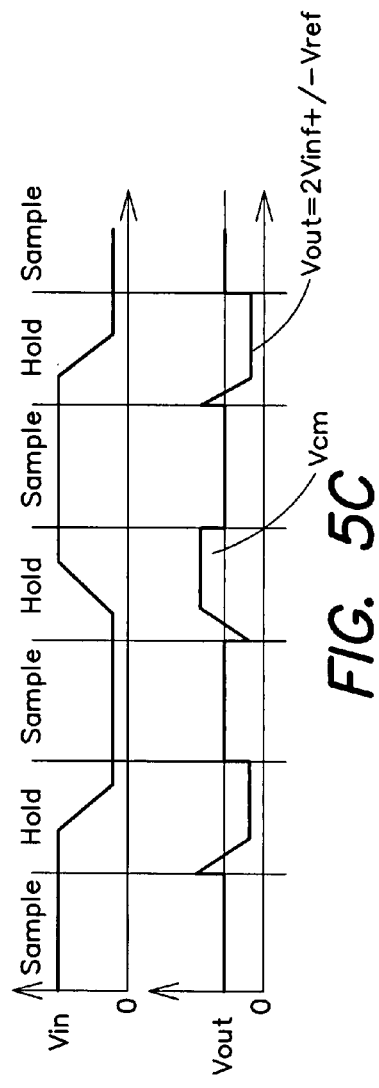

FIG. 5A illustrates the sample phase. During the sample phase, a bias signal Vbiasp is used to bias a gate of PMOS transistor M1, a terminal of capacitor C6, and a terminal of capacitor C5. A bias signal Vbiasn is used to bias a gate of NMOS transistor M2, a terminal of capacitor C8, and a terminal of capacitor C7. Bias signals Vbiasp and Vbiasn are constant signals. An input signal Vin is applied, as shown, to a terminal of capacitors C5, C6, C7, and C8. Thus, during the sample phase, capacitors C5, C6, C7, and C8 all operate as sample capacitors. Since, during the sample phase, no feedback path exists between the buffer output and the switched capacitor circuit, Vout is set to common mode voltage Vcm. In this embodiment, common mode voltage Vcm is the output common mode voltage, and has a constant value. However, any value of Vcm could be used, as the invention is not limited in this respect. Thus, as shown in FIG. 5C, the output signal Vout is constant, and equivalent to Vcm, during the sample phase. This is represented by the horizontal dotted line in FIG. 5C.

FIG. 5B illustrates the common source push-pull dual input operational amplifier during the hold phase. During the hold phase capacitor C5 and capacitor C7 each have a terminal configured to receive a reference signal ±Vref. Thus, during the hold phase, capacitors C5 and C7 each function as sampling capacitors. Reference signal ±Vref may be generated by a bandgap reference circuit (not shown), an external signal source, or any other suitable method, as the invention is not limited in this respect. Whether the positive value of Vref is used, or the negative value depends on the source generating the reference signal, as would be known to those of skill in the art. It should be appreciated, however, that +Vref and −Vref should be symmetrical about the value of Vcm. During the hold phase, capacitors C6 and C8 are configured as feedback capacitors between output signal Vout and the respective gate terminals of transistors M1 and M2. Therefore, the output signal Vout produced at the drain terminal of transistor M1 and the drain terminal of transistor M2 is equal to Vout=2Vinf±Vref, wherein Vinf is equal to the value of Vin at the end of the sample phase. It should be appreciated that since the gate voltages of transistors M1 and M2 respond similarly to each other during the transient portion of the hold phase, the accurate push-pull operation of the MDAC is enabled. It should also be noted that if the buffer illustrated in FIGS. 5A and 5B is connected to additional cascading devices, high output impedance and therefore gain can be realized.

Figure 6A:
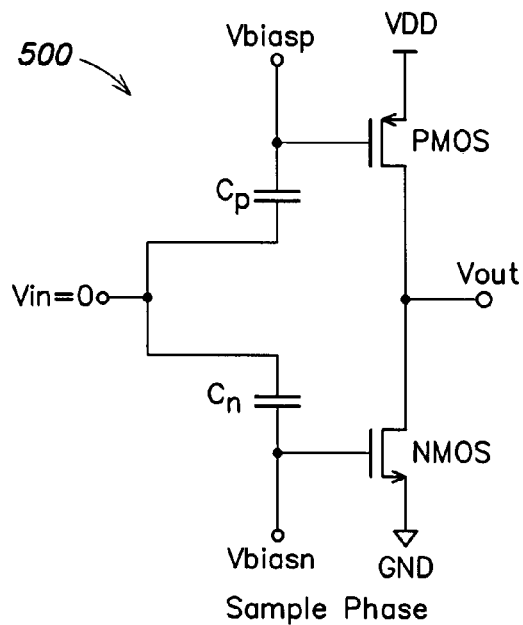
FIGS. 6A and 6B are schematic representations used in the noise analysis of the common source operational amplifier of FIGS. 5A and 5B.

The configuration of common source dual input operational amplifier 500, as illustrated in FIGS. 5A and 5B yields beneficial signal noise reduction. The noise analysis of the circuit may be performed by separately considering the sample and hole phases. FIG. 6A illustrates the dual input operational amplifier during the sample phase. For simplicity, it is assumed during the sample phase that the input signal Vin is zero. It is further assumed that the currents in transistors M1 and M2 are equivalent in the sample phase. In FIG. 6A, capacitor Cp represents the combination of capacitors C5 and C6 of FIG. 5A, while capacitor Cn represents the combination of capacitors C7 and C8 of FIG. 5A.

For simplicity, it is assumed that C=Cp=Cn, although this assumption is not needed. The kT/C noise associated with the capacitors Cp and Cn is added to the gate nodes of transistors M1 and M2 at the end of the sample phase, where k is Boltzmann's constant, T is the temperature in Kelvin, and C is the value of the capacitor. Thus, during the sample phase, the kT/C noise of each capacitor is independent.

Figure 6B:
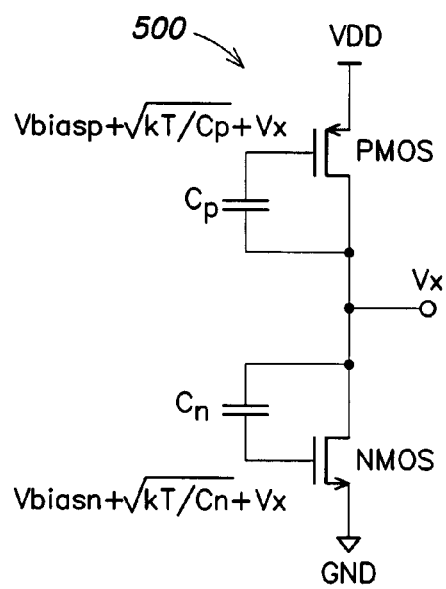

FIG. 6B then shows the common source dual input operational amplifier during the hold phase, when capacitors Cp and Cn are configured as feedback capacitors. The gate node of transistor M1 takes on a value of Vbiasp+(kT/Cp)$^{1/2}$+Vx, where Vx represents Vout at the end of the hold phase. The gate node of transistor M2 takes on the value Vbiasn+(kT/Cn)$^{1/2}$+Vx. If gmp is defined as the transconductance of transistor M1 and gmn is defined as the transconductance of transistor M2, then the current difference between the sample and hold phases in transistor M1 and transistor M2, respectively, is given by −gmp((kT/Cp)+Vx)$^{1/2}$, and gmn((kT/Cn)+Vx)$^{1/2}$, respectively. Therefore, the value of Vx is calculated as $$Vx = Vout = \frac{gmp\sqrt{\frac{kT}{Cp}} + gmn\sqrt{\frac{kT}{Cn}}}{gmp + gmn} \sim \sqrt{\frac{kT}{2C}}$$

which represents the output noise. Thus, the kT/C noise stored on the gates of the PMOS transistor M1 and the NMOS transistor M2 are not independent, but rather are dependent upon each other in the hold phase. The input noise is therefore decided only by the total input capacitor value, regardless of whether the input capacitor value is from a single capacitor, or a combination of capacitors.

Figure 7A:
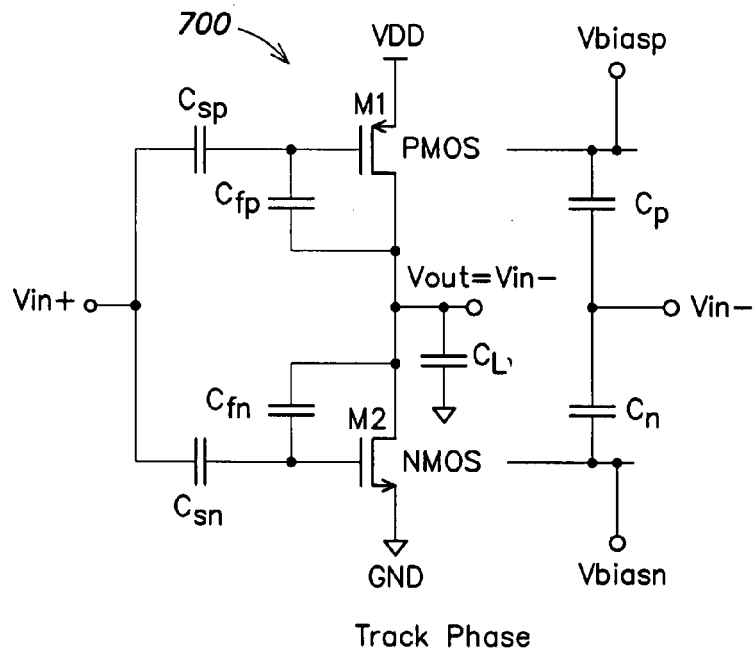
FIGS. 7A-7B are schematic representations of a track phase and hold phase of a common source track and hold circuit as taught herein.
Figure 7B:
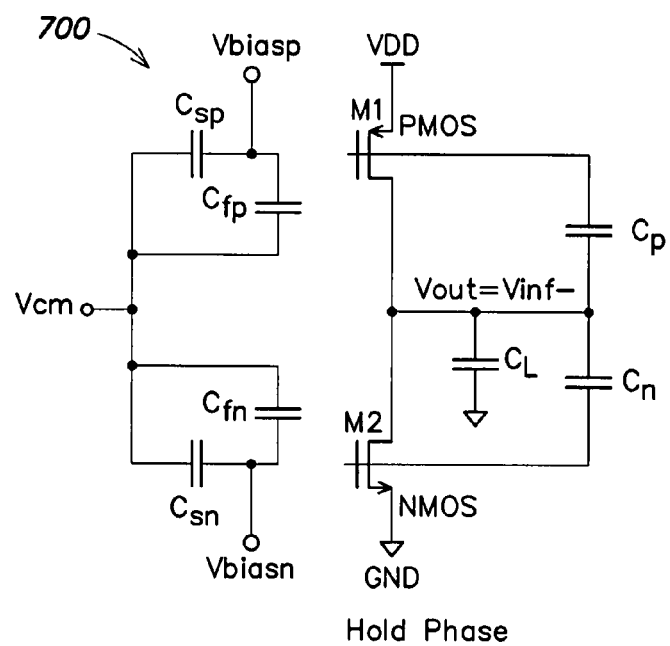

Another example of a common source switched capacitor buffer according to an embodiment of the invention is a track and hold circuit. FIGS. 7A and 7B illustrate the track phase and the hold phase of a differential input switched capacitor buffer 700, of the type previously described in connection with FIG. 2B. However, it should be noted that FIGS. 7A and 7B only represent a single input path of the differential input buffer, for purposes of simplicity.

FIG. 7A illustrates the buffer 700 during the track phase. The buffer comprises sample capacitors Csp and Csn, each configured to receive an input signal Vin+. Capacitors Cfp and Cfn are configured as feedback capacitors, from the output signal Vout to the respective gate terminals of PMOS transistor M1 and NMOS transistor M2. During the track phase, Vout is configured to track Vin−, the second differential of the buffer 700. Also during the track phase, capacitors Cp and Cn are biased by signals Vbiasp, Vbiasn, and Vin−, as shown. Signals Vbiasp and Vbiasn assume constant values.

During the hold phase of buffer 700, as illustrated in FIG. 7B, capacitors Csp, Cfp, Csn, and Cfn are biased by signals Vbiasp, Vbiasn, and Vcm. Signal Vcm represents the input common mode voltage and has a constant value. Capacitors Cp and Cn are connected to the gate terminals of transistors M1 and M2, respectively. Load CL, connected to output signal Vout, maintains the output signal at a value of Vinf−, where Vinf− equals the value of Vin− at the end of the track phase. The noise included in hold phase is determined by only Cp and Cn, which is independent of the kT/C noise generated by Csp, Cfp, Cfn and Csn. It should be appreciated that while the load is illustrated as a capacitor, it could be any type of load, including a resistor, inductor, or any other type of load. The track and hold circuit displays accurate push-pull operation.

The second portion of differential input common source switched capacitor buffer 700 would comprises of a similar circuit to that illustrated, only configured to receive input signal Vin−, the other component of the differential input signal. This second portion has been omitted for purposes of simplicity, but will be readily apparent to those of skill in the art.

Figure 8:
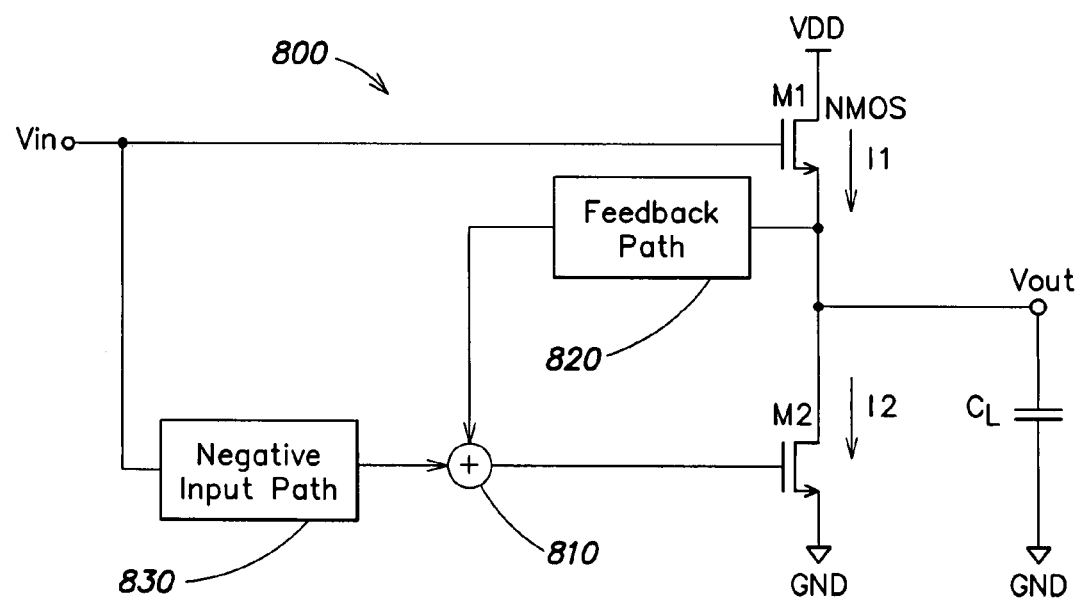
FIG. 8 is a block diagram representation of a source follower buffer as taught herein.

According to another embodiment of the present invention, a switched capacitor buffer operating by the push-pull method may act as a source follower, similar to the buffer 300c of FIG. 3C. As illustrated in FIG. 8, the source follower 800 comprises a transistor M1 and a transistor M2. In the illustrated example, transistors M1 and M2 are NMOS transistors. Transistor M1 has a drain terminal configured to receive a voltage signal VDD and a gate terminal configured to receive input signal Vin. A source terminal of transistor M1 is connected to a drain terminal of transistor M2, this common terminal providing an output signal Vout. This common terminal is also connected to load CL. A second terminal of the load CL, and a source terminal of transistor M2 are connected to ground. Current I1 flows in transistor M1, and a current I2 flows in transistor M2. The source follower 800 further comprises a feedback path 820 connecting output signal Vout to adder 810. A negative input path 830 is also provided which has an input configured to receive input signal Vin and an output connected to the adder 810. An output of the adder 810 is connected to a gate terminal of transistor M2.

In operation, the negative feedback path 820 and the negative input path 830 combine to sense the difference between signal Vout and signal Vin. The gate terminal of transistor M2 is controlled by an output of adder 810, and thus controls the current I2 in transistor M2 dynamically to achieve accurate push-pull operation. As will be seen in view of FIGS. 9 and 10A-10D, the gate voltage of transistor M2 will ultimately return to its initial bias value.

Figure 9:
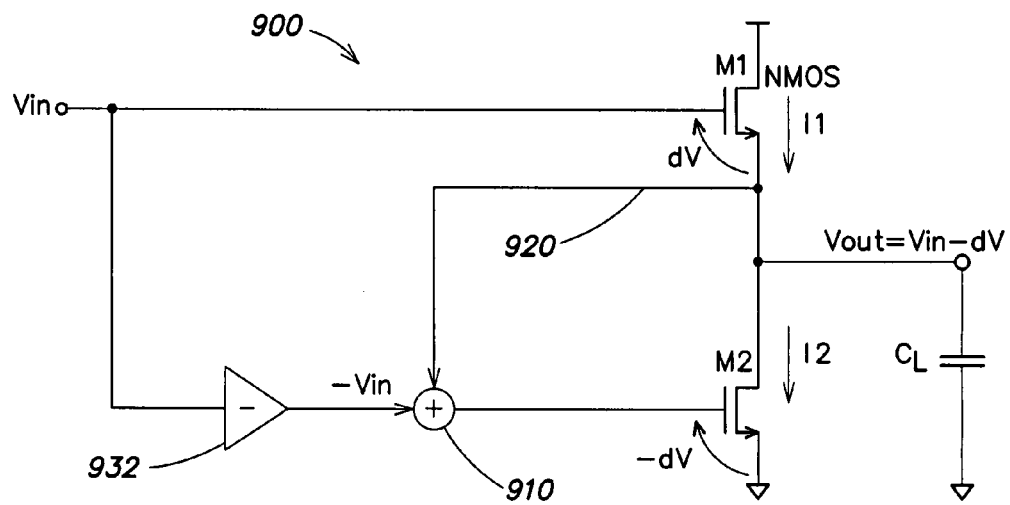
FIG. 9 is a schematic representation of a source follower of the type shown in FIG. 8.
Figure 10A:
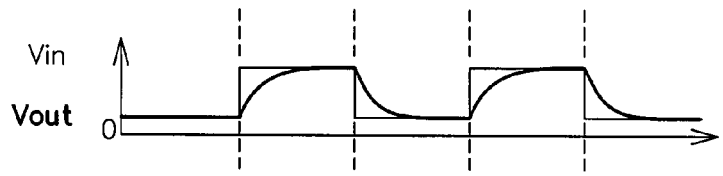
FIGS. 10A-10D illustrate waveforms associated with the source follower of FIG. 9.
Figure 10B:
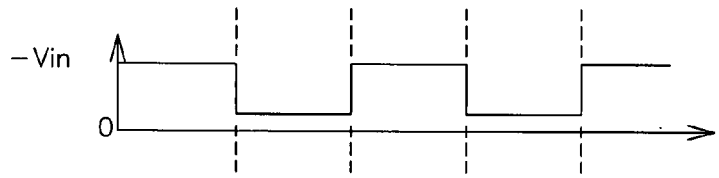
Figure 10C:
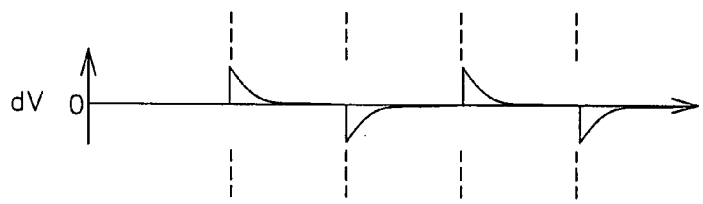
Figure 10D:
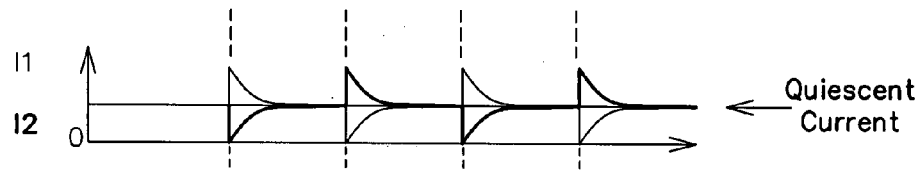

FIG. 9 illustrates an example of a source follower 900, of the type previously described in connection with FIG. 8. Transistors M1 and M2, and load CL are as previously described in connection with FIG. 8. In the illustrated example of FIG. 9, the feedback path 920 is realized by a short circuit between the output signal Vout and the adder 910. The negative input path is realized by an inverter 932. In operation, it is assumed that transistors M1 and M2 can flow a certain non-zero quiescent current. However, transistor M2 does not flow a constant current, as in conventional source followers, but rather is controlled dynamically. Assuming a steady state initially, a change in the value of input signal Vin causes a voltage dV to develop between the source of transistor M1, corresponding to output signal Vout, and the gate of transistor M1, as shown in FIGS. 10B and 10C. This is because transistor M1 does not respond instantaneously to the change in Vin, so that Vout can not immediately track Vin, as shown in FIG. 10A. The feedback path and the negative input path, combined by the adder, operate to create a voltage −dV, equal in magnitude but opposite in sign to voltage dV, between the source terminal of transistor M2 and the gate terminal of transistor M2. Therefore, currents I1 and I2 deviate from the quiescent current in opposite directions of each other, as clearly seen in FIG. 10D. However, as Vout approaches Vin, voltage dV approaches its initial value and the currents I1 and I2 approach the quiescent current value. The output signal Vout of the buffer 900 is given by Vout=Vin−dV.

It should be noted that the initial gate terminal bias signal of transistor M2 can be set. It should be chosen in dependence on the required slew rate and quiescent current consumption of the buffer.

Figure 11B:
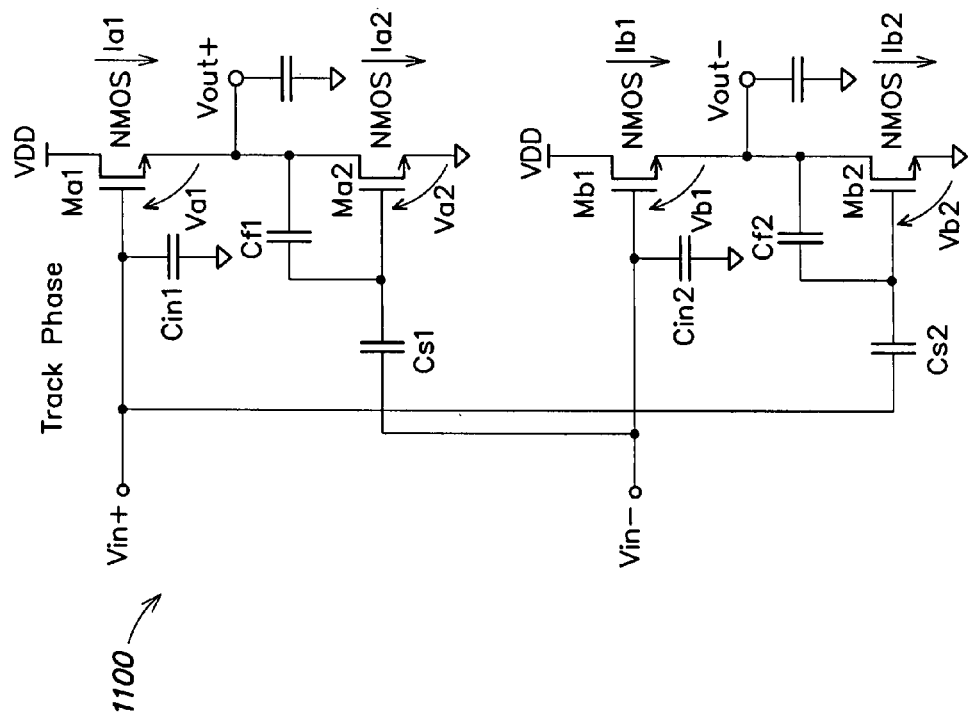
FIGS. 11A-11B are schematic representations of a hold phase and a track phase of a source follower track and hold circuit as taught herein.
Figure 11A:
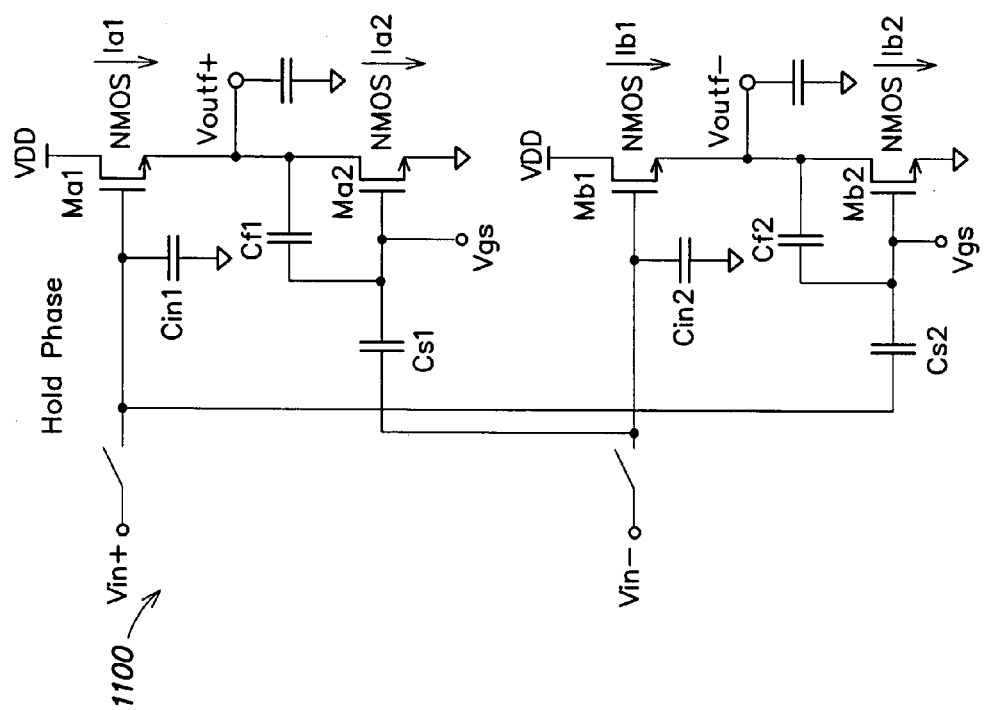

FIGS. 11A and 11B illustrate the hold phase and the track phase of a switched capacitor track and hold circuit implement the source follower operation described in connection with FIGS. 8 and 9. Specifically, the buffer 1100 is a differential input switched capacitor buffer, similar to buffer 200b of FIG. 2B. The buffer comprises transistors Ma1, Ma2, Mb1, and Mb2, all of which are NMOS transistors. The transistors Ma1 and Mb1 operate as pull-up devices, while transistors Ma2 and Mb2 operate as pull-down devices. FIG. 11A illustrates the hold phase.

Figure 12A:
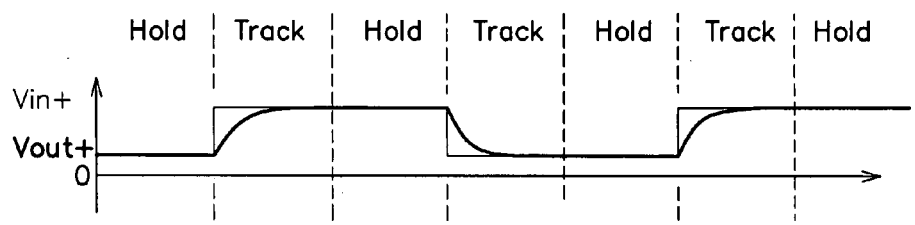
FIGS. 12A-12D illustrate waveforms associated with the source follower track and hold circuit of FIGS. 11A-11B.
Figure 12B:
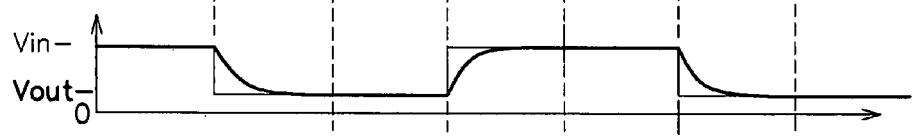
Figure 12C:
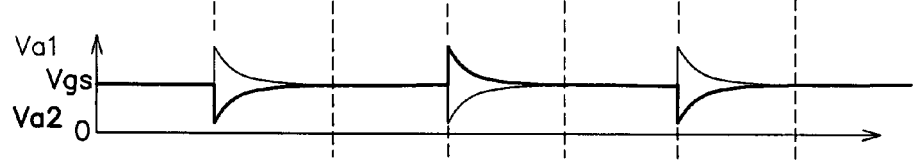
Figure 12D:
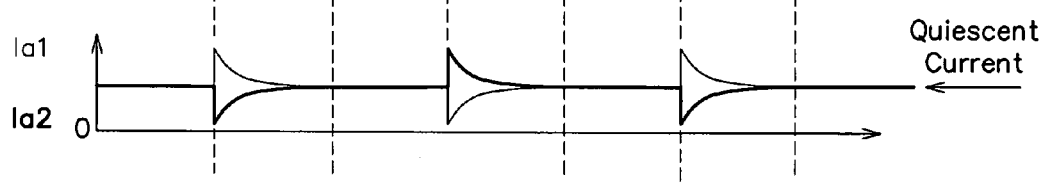

During the hold phase, the switched capacitor buffer does not receive the differential input signals Vin+ and Vin−. Rather, input capacitors Cin1 and Cin2 are storing previous signals. The sampling capacitors Cs1 and Cs2, and the feedback capacitors Cf1 and Cf2 are storing Vinf+, Vinf−, Voutf+, and Voutf−, relative to bias signal Vgs, respectively. In this case, Vinf+, Vinf−, Voutf+, and Voutf− correspond to the values of the respective signals Vin+, Vin−, Vout+, and Vout− at the end of the track phase. A feedback capacitor Cf1 provides a feedback path from output signal Vout+ to a gate terminal of transistor Ma2. Similarly, feedback capacitor Cf2 provides a feedback path from output signal Vout− to a gate terminal of transistor Mb2. The gate terminal of transistor Ma2, and the gate terminal of transistor Mb2, are each biased by signal Vgs, which is a constant signal, as shown in FIG. 12C. Therefore transistors Ma2 and Mb2 operate as current sources during the hold phase, and flow a quiescent current, as illustrated in FIG. 12D.

During the track phase, input capacitor Cin1 and sample capacitor Cs2 receive positive differential input signal Vin+. Input capacitor Cin2 and sample capacitor Cs1 receive negative differential input signal Vin−. The gate terminals of transistors Ma2 and Mb2 become floating nodes. Thus, these transistors are controlled dynamically during the track phase, and no longer work as current sources. The source terminal of transistor Ma1 provides a positive differential output signal Vout+, while a source terminal of transistor Mb1 provides a negative differential output signal Vout−. The output signal Vout+ and the output signal Vout− try to track any changes in Vin+ and Vin−, respectively. However, as shown in FIGS. 12A and 12B, they initially lag behind signals Vin+ and Vin−. Therefore, a voltage Va1 develops between the source terminal of transistor Ma1 and the gate terminal of transistor Ma1. Similarly, a voltage Va2 develops between the source terminal of transistor Ma2 and the gate terminal of transistor Ma2, as shown in FIG. 12C. These voltages give rise to currents Ia1 and Ia2, which deviate from their quiescent value in opposite directions. However, as the signals Vout+ and Vout− approach Vin+ and Vin−, respectively, the values of Va1, Va2, Ia1 and Ia2 approach their static state values.

The track and hold circuit illustrated in FIGS. 11A and 11B displays accurate push-pull operation, with a good slew rate, and low power consumption. However, a drawback of the buffer 1100 is that it requires a start-up circuit to ensure that the output voltages Vout+ and Vout− are initially suitable. Otherwise the gate terminals of transistors Ma2 and Mb2 may assume undesired voltages during the track phase.

Figure 13A:
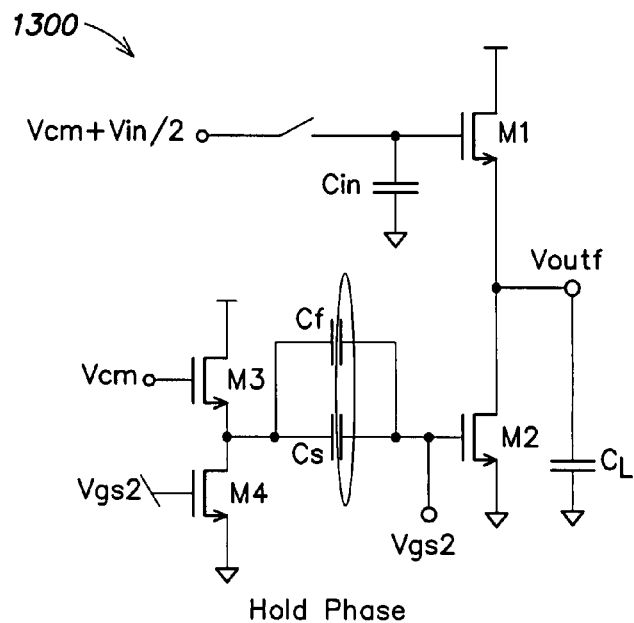
FIGS. 13A-13B are schematic representations of a hold phase and a track phase of another source follower track and hold circuit as taught herein.
Figure 13B:
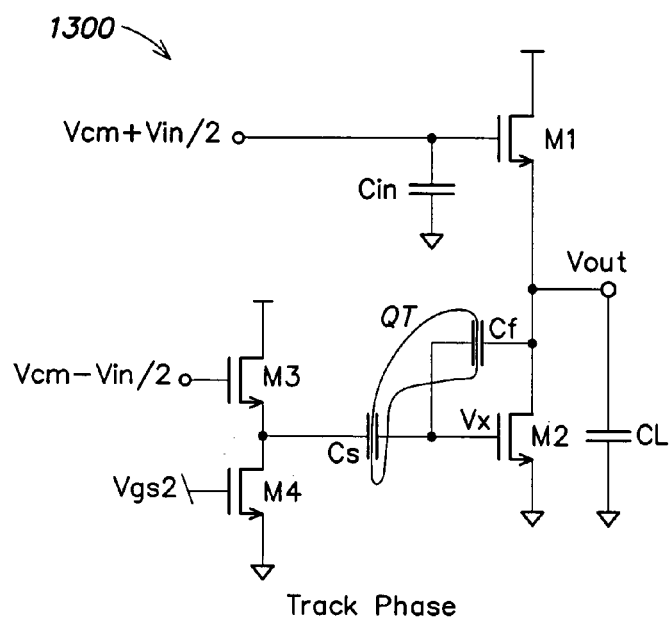

According to another embodiment of the present invention, a differential input switched capacitor buffer is provided that operates as a source follower, and that can be used as a track and hold circuit. FIGS. 13A and 13B illustrate the hold and track phases of the buffer 1300.

As seen in FIG. 13A, the buffer 1300 comprises transistors M1, M2, M3, and M4, which are all NMOS transistors. During the hold phase, common mode voltage Vcm, which is equal to the input common mode voltage, is supplied to the gate terminal of transistor M3. Transistor M4 is biased by constant signal Vgs2. Capacitors Cf and Cs are configured in parallel between the gate terminal of transistor M2 and the source terminal of transistor M3. Input capacitor Cin stores a previous signal, and receives no input. The output voltage Voutf is constant, and equals the value of signal Vout at the end of the track phase.

FIG. 13B illustrates the track phase. During the track phase, input capacitor Cin receives differential input signal Vcm+Vin/2. The gate of transistor M3 receives differential input signal Vcm−Vin/2. The gate terminal of transistor M4 remains biased by signal Vgs2. However, during the track phase capacitor Cf is configured as a feedback capacitor. Thus, the total charge $Q_T$ stored on the the top plates of capacitors Cs and Cf is conserved since the gate of transistor M2 is floating. Thus, only the difference between the value of Vout and Vcm+Vin/2 is sent to the floating gate terminal of transistor M2. In this manner then, a start-up circuit is not needed, in contrast to the track and hold circuit of FIGS. 11A and 11B. It should be noted, however, that the value of capacitor Cf and the value of capacitor Cs should be chosen to be approximately equivalent to each other.

The pull-up and pull-down devices taught in various embodiments of the present invention have been illustrated as transistors, and more specifically as CMOS transistors. However, it should be appreciated that they could be realized by any active three-terminal device. For example, bipolar transistors could also be used. Furthermore, the polarity of the three terminal device is not important, as NMOS and PMOS transistors may be used, or any polarity of active three terminal device.

It should also be appreciated that throughout this application the load CL has been illustrated as a capacitor, but could be any type of load. For example, the load could be a resistor, an inductor, or any other type of load, as the invention is not limited in this respect.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A push-pull circuit receiving an input signal and providing an output signal, the push-pull circuit comprising:
    a pull-up device;
    a pull-down device;
    a switched capacitor circuit coupled to the pull-up device and the pull-down device; and
    at least one feedback path coupling the output signal to the switched capacitor circuit, wherein the feedback path enables dynamic control of the pull-up device and the pull-down device,
    wherein the at least one feedback path comprises a first and second feedback path, and wherein the switched capacitor circuit during a first phase is configured to provide the first feedback path coupling the output signal to the pull-up device and not the pull-down device, and the second feedback path coupling the output signal to the pull-down device and not the pull-up device; and
    wherein during a second phase the first feedback path and the second feedback path are open.

2. The push-pull circuit of claim 1, further comprising a load coupled to the pull-up device.

3. The push-pull circuit of claim 1, further comprising a second pull-up device and a second pull-down device, wherein the switched capacitor circuit is coupled to the second pull-up device and the second pull-down device.

4. The push-pull circuit of claim 1, wherein the switched capacitor circuit is a single input switched capacitor circuit.

5. The push-pull circuit of claim 1, wherein the pull-up device, pull-down device, and switched capacitor circuit are configured as a source follower.

6. The push-pull circuit of claim 1, wherein the pull-up device, pull-down device, and switched capacitor circuit are configured as a track and hold circuit.

7. The push-pull circuit of claim 1, wherein the pull-up device, pull-down device, and switched capacitor circuit are configured as an operational amplifier.

8. The push-pull circuit of claim 1, wherein the pull-up device and the pull-down device each include a transistor, and wherein the switched capacitor circuit is coupled to a gate terminal of the pull-up device and a gate terminal of the pull-down device.

9. The push-pull circuit of claim 8, wherein the switched capacitor circuit is configured to dynamically control the gate terminal of the pull-down device.

10. The push-pull circuit of claim 8, wherein the pull-up device and the pull-down device are coupled to each other in a common source configuration.

11. The push-pull circuit of claim 8, wherein the pull-up device and the pull-down device are coupled to each other in a common drain configuration.

12. The push-pull circuit of claim 8, wherein the pull-up device and the pull-down device are coupled to each other in a source follower configuration.

13. The push-pull circuit of claim 1, wherein the pull-up device and the pull-down device are coupled to each other.

14. The push-pull circuit of claim 13, wherein the pull-up device and the pull-down device are coupled at a common node, and wherein the common node is configured to provide the output signal of the push-pull circuit.

15. The push-pull circuit of claim 1, wherein the at least one feedback path comprises a capacitor.

16. The push-pull circuit of claim 1, wherein the at least one feedback path comprises a short circuit.

17. The push-pull circuit of claim 1, wherein the pull-up device includes a transistor.

18. The push-pull circuit of claim 17, wherein the transistor is a MOS transistor.

19. The push-pull circuit of claim 1, wherein the pull-down device includes a transistor.

20. The push-pull circuit of claim 19, wherein the transistor is a MOS transistor.

21. The push-pull circuit of claim 1, wherein the switched capacitor circuit is a differential input switched capacitor circuit.

22. The push-pull circuit of claim 21, wherein the push-pull circuit is further configured to provide a differential output.

23. A method of operating a push-pull circuit comprising a pull-up device and a pull-down device, the method comprising:

using a switched capacitor circuit to control the pull-up device and the pull-down device to achieve push-pull operation, wherein the push-pull operation comprises dynamic control of the pull-up device and the pull-down device, wherein the pull-up device includes a first transistor and the pull-down device includes a second transistor, and wherein, using the switched capacitor circuit to control the pull-up device and the pull-down device comprises during a first phase using a first feedback path to input an output signal of the push-pull circuit to the switched capacitor circuit and using the switched capacitor circuit to control a gate terminal of the pull-up device with a first control signal resulting at least in part from the first feedback path, and during the first phase using a second feedback path to input an output signal of the push-pull circuit to the switched capacitor circuit and using the switched capacitor circuit to control a gate terminal of the pull-down device with a second control signal resulting at least in part from the second feedback path, and;

during a second phase opening the first feedback path and the second feedback path.

24. The method of claim 23, further comprising:

sensing an input signal of the push-pull circuit;

sensing the output signal of the push-pull circuit; and controlling the gate terminal of the pull-down device in response to sensing a difference between the input signal and the output signal.

25. The push-pull circuit of claim 1, wherein the first feedback path comprises a first capacitor.

26. The push-pull circuit of claim 1, wherein the second feedback path comprises a capacitor.

27. The push-pull circuit of claim 25, wherein the second feedback path comprises a first capacitor.

* * * * *

UNITED STATES PATENT AND TRADEMARK OFFICE
Certificate

Patent No. 7,295,042 B2                                                               Patented: November 13, 2007

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Shingo Hatanaka, Cambridge, MA (US); and Christopher W. Mangelsdorf, Tokyo (JP).

Signed and Sealed this Seventeenth Day of November 2009.

REXFORD N. BARNIE
*Supervisory Patent Examiner*
Art Unit 2819